United States Patent [19]
Desroches

[11] Patent Number: 5,550,496
[45] Date of Patent: Aug. 27, 1996

[54] HIGH SPEED I/O CIRCUIT HAVING A SMALL VOLTAGE SWING AND LOW POWER DISSIPATION FOR HIGH I/O COUNT APPLICATIONS

[75] Inventor: Alan R. Desroches, San Jose, Calif.

[73] Assignee: Hewlett-Packard Company, Palo Alto, Calif.

[21] Appl. No.: 509,066

[22] Filed: Jul. 31, 1995

[51] Int. Cl.⁶ ................................................. H03F 3/45
[52] U.S. Cl. .............................. 327/108; 327/53; 327/63; 327/319; 327/408
[58] Field of Search ...................... 326/82, 101; 327/108, 327/319, 83, 63, 403–4, 407–8

[56] References Cited

U.S. PATENT DOCUMENTS

| | | | |
|---|---|---|---|
| 4,697,095 | 9/1987 | Fujii | 327/566 |
| 4,756,006 | 7/1988 | Rickard | 327/403 |
| 4,780,629 | 10/1988 | Unger et al. | 326/82 |
| 4,945,267 | 7/1990 | Galbraith | 327/566 |
| 5,378,950 | 1/1995 | Takamoto et al. | 327/403 |
| 5,461,333 | 10/1995 | Condon et al. | 327/565 |

*Primary Examiner*—Margaret Rose Wambach
*Attorney, Agent, or Firm*—Howard R. Boyle

[57] ABSTRACT

An interchip high speed I/O circuit having a low voltage swing and on-chip transmission line terminations. The present invention provides a high speed I/O circuit that uses a small voltage swing to keep power dissipation in the overall system to a minimum and particularly in the transmission line termination loads. A differential receiver circuit compares a data signal input to a reference signal, both sent from a driver chip, to determine the appropriate output response. Both the data signal and the reference signal are current controlled which reduces the di/dt noise generated by parasitic inductances.

11 Claims, 5 Drawing Sheets

5,550,496

HIGH SPEED I/O CIRCUIT HAVING A SMALL VOLTAGE SWING AND LOW POWER DISSIPATION FOR HIGH I/O COUNT APPLICATIONS

FIELD OF THE INVENTION

This invention relates to integrated circuit design. In particular, this invention relates to an apparatus and method for high speed communications between two integrated circuits.

BACKGROUND OF THE INVENTION

High speed computing devices are constructed by combining a number of integrated circuits (ICs) together to perform the required tasks. These integrated circuits are interconnected so that instructions and data are communicated between the ICs. The signal paths between the ICs are called transmission lines and the circuits that do the communicating are referred to as Input/Output (I/O) circuits. For signal quality reasons, a high speed transmission line needs to be terminated by a resistor load having the same resistance value as the characteristic impedance as the transmission line. This termination load dissipates power and therefore generates heat which is undesirable.

As circuit speeds and clock rates increase there is a need for I/O circuits that can handle these speeds but also have low power dissipation and can properly terminate a transmission line. There are two basic approaches to termination: Terminate at the driver (output) source and terminate at the destination (input) device. Source termination has low power dissipation properties. With source termination, receiving devices closest to the driver incur the longest latency due to the time it takes a signal to propagate to the end of the transmission line and be reflected back to the receiver. Terminating at the destination gives the best quality signal at the destination but suffers from a greater power dissipation than does source termination.

This invention is applicable to point to point communication which is used when the highest speeds are needed. Point to point means there is a driver at one end of the transmission line and a receiver at the other end. There are no receivers or drivers distributed along the transmission line. Any receivers or drivers distributed along the transmission line cause discontinuities which result in degraded signal quality so these are avoided at the highest speeds.

One typical prior attempt to provide high speed communications and low power termination of the transmission line is to use a lower power supply voltage of approximately 1.2v–1.8v and a reduced voltage swing in an otherwise 3.3v system. This reduces the voltage developed across the transmission line termination and therefore reduces the power dissipation in the termination device. An example of this approach to high speed I/O is the Gunning Transceiver Logic (GTL) configuration which is shown in FIG. 1.

FIG. 1 illustrates a NMOS driver circuit 101 located on a first IC 103 and an input circuit 105 located on a second IC 107. The two circuits 101 and 105 are connected by a transmission line 109 having an end termination load 111 and a source termination load 113. The transmission line 109 typically has a characteristic impedance of 50 ohms and therefore the terminating load 111 is designed to have the same resistance value (50 ohms).

In this circuit the GTL power components are:

1. Power dissipated by both termination resistors 113 and 111 ($P_{term}$):

$$P_{term} = \frac{1}{2} \times \frac{(1.2v - 0.3v)^2}{50\,ohm} \times 2 = 16.2\,mW$$

2. Power dissipated by the NMOS driver circuit ($P_{tx}$):

$$P_{tx} = \frac{1}{2} \times (0.3v) \times \left(\frac{1.2v - 0.3v}{50\,ohm}\right) = 2.7\,mW$$

3. Current delivered by each termination resistor ($I_{dc}$):

$$I_{dc} = \frac{(1.2v - 0.3v)}{50\,ohm} = 18\,mA$$

The ½ is to consider average power with the signal switching at a 50% duty cycle rate.

The power in the receivers of all approaches is similar and is dependent on the capacitive load and the circuit speed required.

Another approach is to use a receiver circuit, which is an inverter in which the switching threshold is skewed low to accommodate a signal voltage swing centered at approximately (1.2v+0.3v)/2=0.75v.

This second approach is illustrated in FIG. 2. This figure differs from FIG. 1 in that the receiving chip 201 has an inverting receiver 203. This type of receiver 203 is simpler than the receiver circuit 105 but the overall system has the same power dissipation as the system illustrated in FIG. 1.

For point to point applications these two schemes require a single termination resistor so for both the power results become:

$$P_{term} = 8.1\,mW$$
$$P_{tx} = 2.7\,mW$$
$$I_{dc} = 18\,mA$$

The problem with both of these approaches is the power dissipation in the termination loads is so great that the loads cannot be fabricated as part of the receiving IC, especially in high I/O count (500+I/O lines) applications. Because the termination loads have to be mounted off the receiving IC, there is a transmission line stub to make the connection to the load (resistor). This stub presents a discontinuity in the main transmission line and causes reflections which, at the circuit input, appear as glitches on the high or low level or as half level shoulders on incoming pulses. These glitches are illustrated in FIGS. 3 A–C.

FIG. 3A illustrates a glitch 301 on a low to high level incoming pulse 303. FIG. 3B illustrates a glitch 305 on a high to low level incoming pulse 307 and FIG. 3C illustrates a half level shoulder glitch 309 on a high to low level incoming pulse 311.

What is needed in the industry is a high speed I/O circuit that has a low power dissipation such that the transmission line termination can be fabricated as part of the receiving IC to eliminate impedance discontinuities and the associated glitches.

SUMMARY OF THE INVENTION

The present invention provides new high speed I/O circuits that use a small voltage swing to keep power dissipation in the overall system to a minimum and especially in the termination resistor. A controlled current data driver is utilized to keep variations in the I/O signal swing to less than what process, temperature and voltage variations would otherwise produce. In addition, a differential receiver circuit is utilized which is constructed as a comparator. The receiver compares the received signal from the controlled current data driver to a reference voltage which is also sent from the driver IC. This novel I/O transmission system reduces the power dissipation in the termination loads such that the termination loads can be placed on the receiving chip as PMOS transistors and thereby eliminate the need for a transmission line stub to an external termination load.

The Vds (0.7v) of the termination PMOS transistors is small and Vgs (1.2v) is large which minimizes the nonlinear characteristic of the PMOS termination transistors. Also, because the driver is a controlled current circuit, the di/dt noise generated by the inherent parasitic inductances at high signal speeds is minimized.

DETAILED DESCRIPTION OF THE INVENTION

Figure 1:
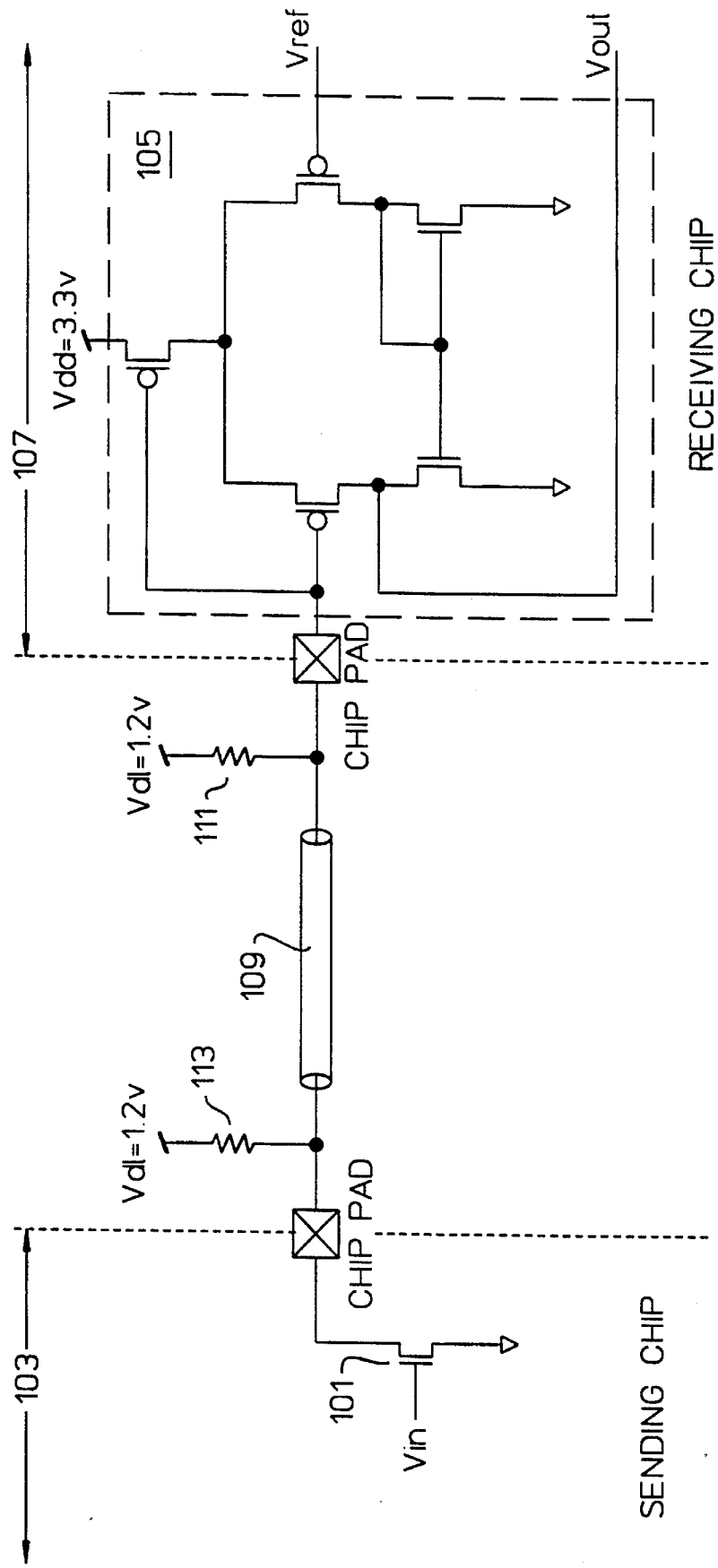
FIG. 1 illustrates a prior art I/O circuit.
Figure 2:
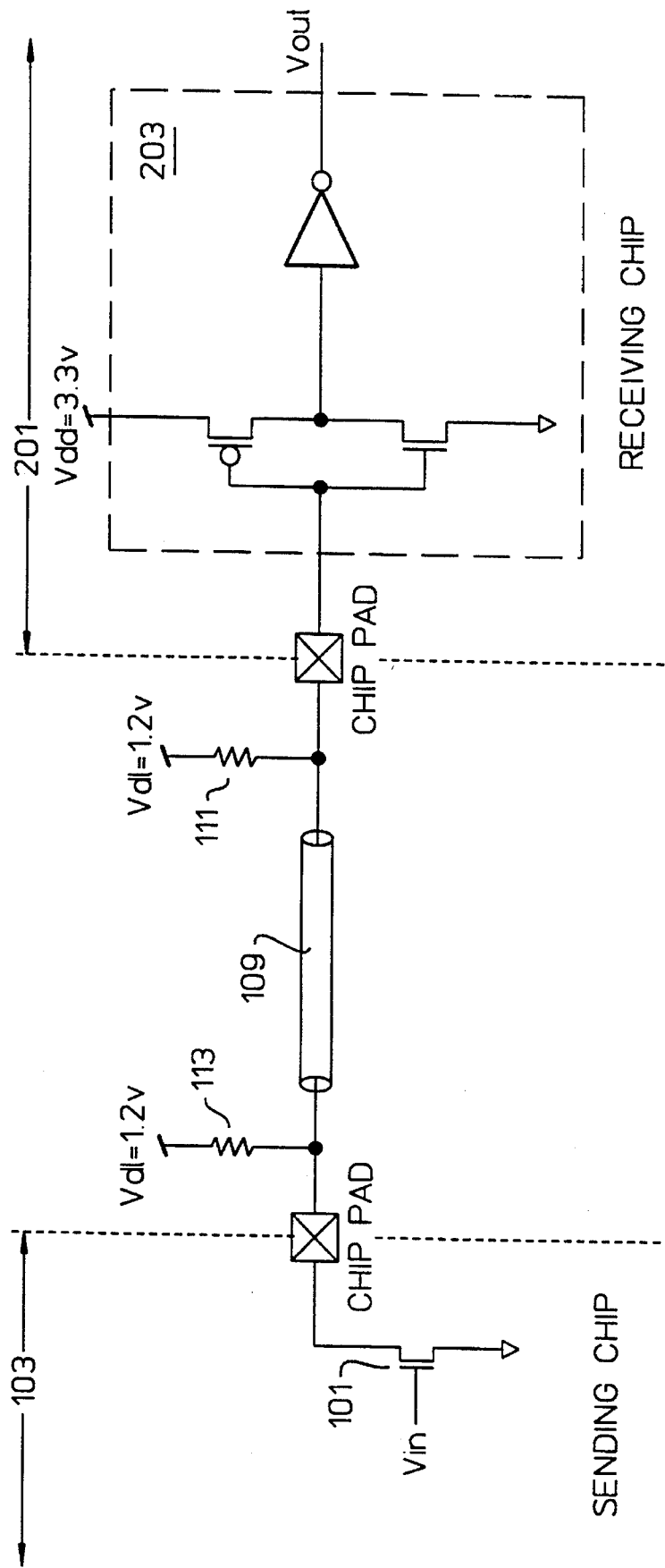
FIG. 2 illustrates a prior art I/O circuit using an inverter.
Figure 3C:
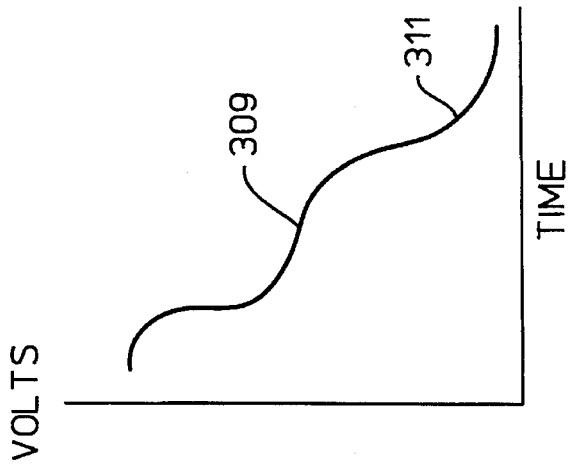
FIGS. 3A–C illustrate glitches in transmitted signals due to transmission line termination stubs.
Figure 3B:
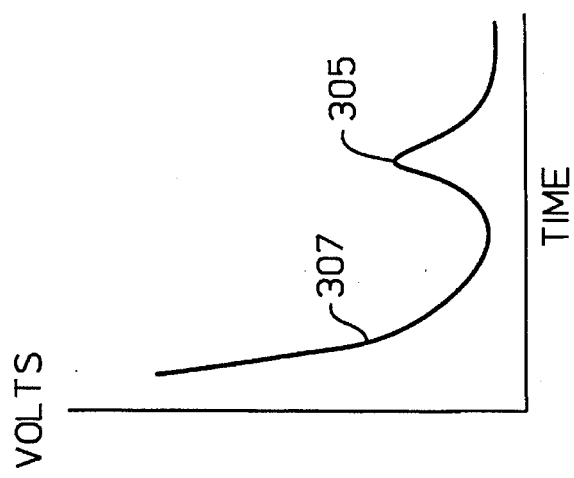
Figure 3A:
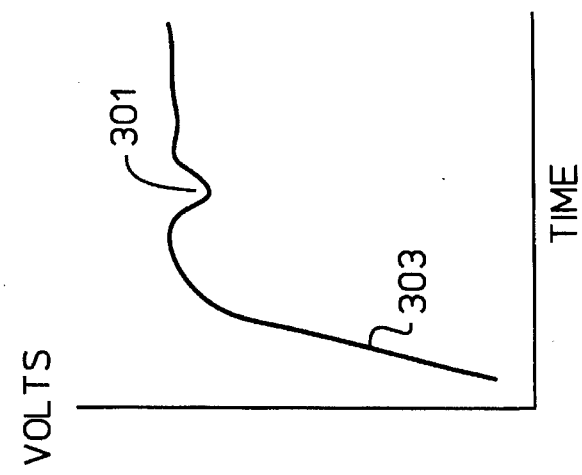
Figure 4:
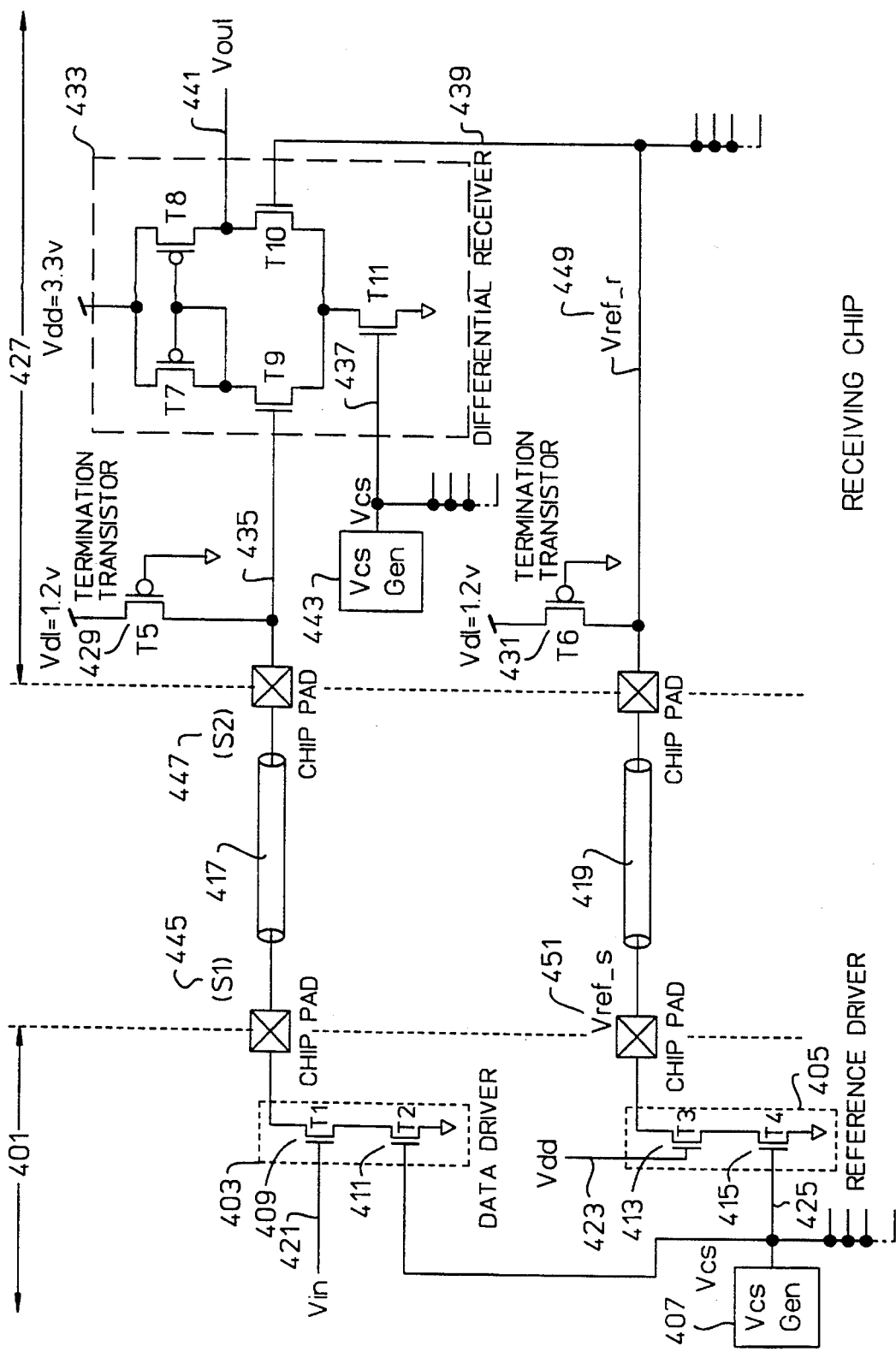
FIG. 4 illustrates a preferred embodiment of the present invention.

FIG. 4 illustrates a high speed I/O system according to the present invention. A driver IC 401 includes a data driver circuit 403, a reference driver circuit 405 and a voltage source 407. Driver circuit 403 is constructed by connecting two NMOS transistors in series with the source of the first transistor 409 connected to the drain of the second transistor 411. Driver circuit 405 is constructed in similar manner with the source of transistor 413 connected to the drain of transistor 415. The sources of transistors 411 and 415 are connected to signal ground. The drain of transistor 409 is connected through an IC pad to a data transmission line 417 and the drain of transistor 413 is connected through an IC pad to a reference transmission line 419.

The gate input 421 of transistor 409 is connected to an input signal Vin and the gate input of transistor 411 is connected to the voltage source 407. The gate input 423 of transistor 413 is connected to a voltage source Vdd which is approximately 3.3 volts. A constant current voltage source 407 is also connected to the gate input 425 of transistor 415. The constant current voltage source 407 is designed to output a voltage of approximately 1 volt which is slightly higher than the transistor threshold voltage (Vt) for a NMOS transistor. This voltage source limits the current that can flow through transistors 411 and 415.

The receiving IC 427 is constructed with a data transmission line termination load transistor 429 which is connected between the data transmission line 417 and a low voltage source Vdl of approximately 1.2 volts. In like manner, a reference transmission line termination load transistor 431 is connected between the reference transmission line 419 and Vdl. Both termination transistors 429 and 431 are constructed to have the same resistance value as the characteristic impedance of the transmission lines they terminate. Basically the transistors 429 and 431 act as resistive devices having an impedance of approximately 50 ohms.

A differential receiver 433 is also constructed on the receiving IC 427. This differential receiver is constructed as a comparator and has three inputs 435, 437 and 439 and an output 441. Input 435 of the differential receiver 433 is connected to the data transmission line 417 and input 439 is connected to the reference transmission line 419. An on chip voltage source 443 similar to voltage source 407 is provided on the receiving IC and is connected to input 437 of the differential receiver 433.

The voltage sources 407 and 443 are current mirror circuits that generate the correct voltages to produce the desired current in the drivers and differential receivers. These voltages can be shared by many drivers and receivers (not shown). The circuits used for voltage sources 407 and 443 are the same and are well known in the art.

Signals (S1) 445 and (S2) 447 swing from 1.2v to 0.5v in response to the data driver 403 being turned off and on respectively. The width of the gate of transistor 415 is constructed such that it is half as wide as the width of the gate of transistor 411. So the current flowing from the termination transistor 431 to transistor 413 and through transistor 415 is ½ of the current flowing through transistors 429, 409 and 411.

The signals Vref_r 449 and Vref_s 451 are therefore essentially static voltage levels centered about the high and low level of signal (S2) 447. While temperature changes in the driver chip 401 will cause minor voltage variations in the level of Vref_r, the value of Vref_r 451 will track the swing of (S2) very well since they are created on the same chip. The signal Vref_r can serve as the reference input on several comparator circuits (not shown) which would be constructed on the receiving IC 427.

Figure 5:
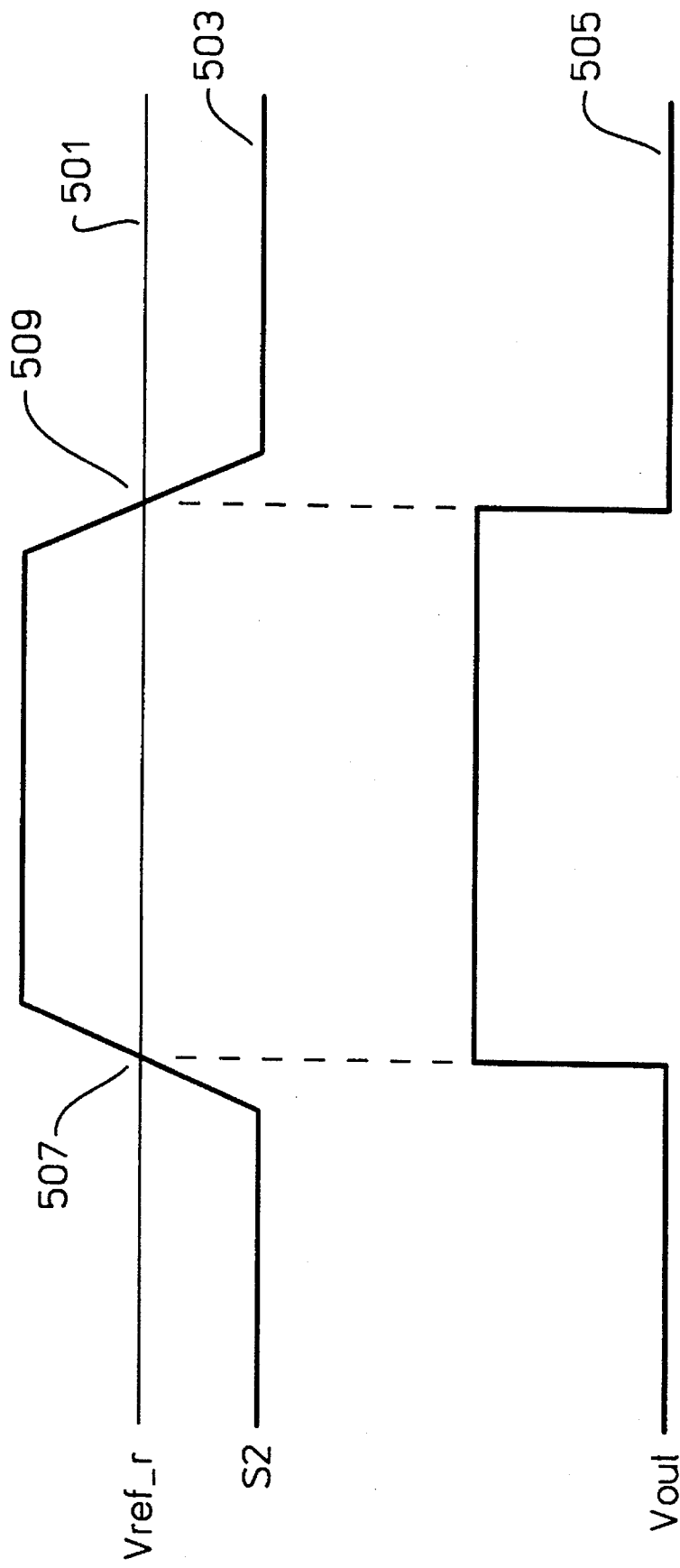
FIG. 5 illustrates the relationship between the reference signal and the data signal in the present invention.

FIG. 5 illustrates the relationship between the Vref_r, the S2 signal, and the output of the differential receiver 433. As illustrated, the signal Vref_r 501 has a voltage level of approximately half of the voltage swing of signal S2 (503). As signal S2 swings from less than Vref_r to more than Vref_r (shown at point 507), the output of the differential receiver Vout 505 transitions to a high value (almost 3.3 Volts in the present invention). When S2 swings from more to less than Vref_r (shown at point 509, the output of the differential receiver Vout 505 transitions to a low value (almost Vss). Of course, the differential receiver can be designed to invert the data driver signal. Referring back to FIG. 4, the power dissipation in termination transistor 429, the driver 403, and the current sourced by the termination loads are:

$$P_{term} = \frac{1}{2} \times \frac{(0.7\,v)^2}{50\,ohm} \times 2 = 4.9\,mW$$

$$P_{tx} = \frac{1}{2} \times (1.2 - .7) \times \left(\frac{0.7\,v}{50\,ohm}\right) = 3.5\,mW$$

$$I_{dc} = \frac{(0.7\,v)}{50\,ohm} = 14\,mA$$

This novel high speed I/O circuit reduces the power dissipation of the transmission line termination loads from 8.1 mW each in the prior art systems to 4.9 mW. This is low enough to enable the termination to be advantageously constructed on the receiving IC. As such, there is no need for off chip terminations and the attendant impedance discontinuities in the transmission line. The power dissipation in the driver circuit is modestly increased from 2.7 mW in the prior art systems to 3.5 mW by utilizing an I/O circuit according to the present invention. However, the total power dissipation in the driver and in the termination is reduced by 22% and, the power dissipation in the termination resistors is reduced by 44%.

While a preferred embodiments of the invention have been described, other embodiments of the invention will be apparent to those skilled in the art from a consideration of this specification or practice of the invention disclosed herein. For example, instead of PMOS transistors and the particular differential receiver illustrated, other types of transistors and differential receivers can be used to achieve the described advantages. Therefore it is intended that the specification and examples be considered as exemplary only, with the scope of the invention being defined by the following claims.

I claim:

1. An interchip high speed communications apparatus comprising:

a first integrated circuit having a controlled current data driver having an output and the first integrated circuit also having a reference driver having an output;

a second integrated circuit having a differential receiver with a data input, a reference input and the differential receiver also having an output;

a data transmission line electrically connecting the output of the data driver to the data input of the differential receiver;

a reference transmission line electrically connecting the output of the reference driver to the reference input of the differential receiver; and the differential receiver comprising a comparator for comparing said data input voltage with said reference input voltage and operative to output a first voltage level in response to a voltage on the data input being higher than a voltage on the reference input and the differential receiver being operative to output a second voltage level in response to a voltage on the data input being lower than a voltage on the reference input; and a termination device fabricated as part of said second integrated circuit, wherein the power dissipation on said communications apparatus is minimized.

2. An apparatus as in claim 1 wherein:

the controlled current data driver sends either a high voltage level or a low voltage level to the differential receiver; and the reference driver sends an approximately constant voltage to the differential receiver where the approximately constant voltage has a value less than the high voltage level and more than the low voltage level.

3. An apparatus as in claim 2 wherein:

the approximately constant voltage from the reference driver tracks minor voltage variations in the value of the high or low voltage levels from the constant current data driver.

4. An apparatus as in claim 3 wherein:

a common constant current source controls the amount of current either the reference driver or the controlled current data driver can sink.

5. An interchip high speed communications apparatus comprising:

a first integrated circuit having a controlled current data driver having an output and the first integrated circuit also having a controlled current reference driver having an output;

a second integrated circuit having a differential receiver with a data input, a reference input and the differential receiver also having an output;

a data transmission line electrically connecting the output of the constant current data driver to the data input of the differential receiver;

a reference transmission line electrically connecting the output of the constant current reference driver to the reference input of the differential receiver;

the differential receiver being operative to output a first voltage level in response to a voltage on the data input being higher than a voltage on the reference input and the differential receiver being operative to output a second voltage level in response to a voltage on the data input being lower than a voltage on the reference input;

the second integrated circuit having a first resistive termination device connected to the reference transmission line and connected to the reference input of the differential receiver where the first resistive device terminates the reference transmission line with approximately the same resistance as the characteristic impedance of the reference transmission line;

the second integrated circuit having a second resistive termination device connected to the data transmission line and connected to the data input of the differential receiver where the second resistive device terminates the data transmission line with approximately the same resistance as the characteristic impedance of the data transmission line; and first and second termination devices fabricated as part of said second integrated circuit.

6. An apparatus as in claim 5 wherein:

the first and second resistive devices are transistors constructed on the second integrated circuit.

7. An apparatus as in claim 6 wherein:

the transistors are metal oxide silicon (MOS) transistors.

8. An apparatus as in claim 7 wherein:

the controlled current data driver sends either a high voltage level or a low voltage level to the differential receiver; and the controlled current reference driver sends an approximately constant voltage to the differential receiver where the approximately constant voltage has a value less than the high voltage level and more than the low voltage level.

9. An apparatus as in claim 8 wherein:

the approximately constant voltage from the reference driver tracks minor voltage variations in the value of the high or low voltage levels from the constant current data driver.

10. An apparatus as in claim 6 wherein:

the first resistive device sources a first current having a maximum value to the controlled current data driver and the second resistive device sources a current to the controlled reference driver having a value less than the maximum value of the first current.

11. An apparatus as in claim 10 wherein:

the second resistive sources a current having a value of approximately one-half of the maximum value of the first current.

* * * * *